(12) United States Patent
Pan et al.

(10) Patent No.: US 12,432,876 B2
(45) Date of Patent: Sep. 30, 2025

(54) CONTAINERIZED IMMERSION COOLING SYSTEM

(71) Applicant: Lonestar Dream Inc., Austin, TX (US)

(72) Inventors: Zhibiao Pan, Austin, TX (US); Lin Li, Tianjin (CN); Jianlin Gao, Beijing (CN); Qipeng Hu, Beijing (CN); Wentao Sun, Beijing (CN)

(73) Assignee: Lonestar Dream Inc., Austin, TX (US)

( * ) Notice: Subject to any disclaimer, the term of this patent is extended or adjusted under 35 U.S.C. 154(b) by 221 days.

(21) Appl. No.: 18/456,173

(22) Filed: Aug. 25, 2023

(65) Prior Publication Data

US 2024/0074095 A1 Feb. 29, 2024

Related U.S. Application Data

(60) Provisional application No. 63/373,653, filed on Aug. 26, 2022.

(51) Int. Cl.
*H05K 7/20* (2006.01)

(52) U.S. Cl.
CPC ..... *H05K 7/20236* (2013.01); *H05K 7/20272* (2013.01)

(58) Field of Classification Search
CPC .......... H05K 7/20236; H05K 7/20272; H05K 7/20781
See application file for complete search history.

(56) References Cited

FOREIGN PATENT DOCUMENTS

RU 2500013 C1 * 11/2013

* cited by examiner

*Primary Examiner* — Emmanuel E Duke
(74) *Attorney, Agent, or Firm* — Husch Blackwell LLP (57) ABSTRACT

A containerized immersion cooling system is provided. The system includes a container with a tank provided therein, wherein the container includes a first side wall having a first port and a second port; a coolant inlet pipe coupled to a first side of the first port; a warmed fluid pipe coupled to a first side of the second port; and a coolant distributor coupled to a second side of the first port.

20 Claims, 9 Drawing Sheets

CONTAINERIZED IMMERSION COOLING SYSTEM

CROSS-REFERENCE TO RELATED APPLICATION

This application claims the benefit of the filing date of U.S. Provisional Application Ser. No. 63/373,653 filed Aug. 26, 2022, entitled, "Immersion Cooling System", which is hereby incorporated by reference as if fully set forth herein.

TECHNICAL FIELD

This disclosure generally relates to a cooling system. Specifically, this disclosure relates to an immersion cooling system. More particularly, aspects of this disclosure relate to an immersion cooling system suitable to cool computer devices used for cryptocurrency mining.

BACKGROUND

High performing computing units are generally used in mining cryptocurrencies. However, computing units may generate heat during prolonged performance. Thus, there is a need for an efficient mean to cool down computer units.

Although immersion cooling has been used to cool down computing units, immersion cooling systems can be expensive to manufacture and to maintenance. As such, there is a need for a low-cost immersion cooling system that can also be easy to maintenance.

BRIEF SUMMARY

A first aspect of this disclosure pertains to a containerized immersion cooling system including a container with a tank provided therein, wherein the container includes a first side wall having a first port and a second port; a coolant inlet pipe coupled to a first side of the first port; and a warmed fluid pipe coupled to a first side of the second port.

A second aspect of this disclosure pertains to the system of the first aspect further including a coolant distributor coupled to a second side of the first port.

A third aspect of this disclosure pertains to the system of the second aspect further including a mesh provided on top of the coolant distributor.

A fourth aspect of this disclosure pertains to the system of the second aspect, wherein the coolant distributor further includes a first frame including a connector configured to be coupled to the first port; a plurality of pipes coupled to the first frame, wherein each of the plurality of pipes includes a plurality of holes on a top side of the coolant distributor; and a second frame, wherein the first frame is provided at a first end of the plurality of pipes and the second frame is provided at a second end of the plurality of pipes.

A fifth aspect of this disclosure pertains to the system of the fourth aspect, wherein the first frame is internally hollow such that the plurality of holes of each of the plurality of pipes is in fluid communication with the connector.

A sixth aspect of this disclosure pertains to the system of the first aspect further including an outlet pipe coupled to a second side of the second port.

A seventh aspect of this disclosure pertains to the system of the sixth aspect, wherein the tank further includes a second side wall, wherein the first side wall is provided at a first end of the tank and the second side wall is provided at a second end of the tank opposite the first end; a third side wall and a fourth side wall flanking the first side wall and the second side wall; and a base wall coupled to a bottom side of the first side wall, the second side wall, the third side wall, and the fourth side wall, wherein the first side wall, the second side wall, the third side wall, the fourth side wall, and the base wall together define a hallow portion of the tank.

An eighth aspect of this disclosure pertains to the system of the seventh aspect, wherein the tank further includes an inner side wall provided proximal to the third side wall, wherein the third side wall and the inner side wall together define a channel.

A ninth aspect of this disclosure pertains to the system of the eighth aspect, wherein the outlet pipe is provided within the channel.

A tenth aspect of this disclosure pertains to the system of the eighth aspect, wherein the inner side wall extends from the first side wall to the second side wall.

An eleventh aspect of this disclosure pertains to the system of the eighth aspect, wherein the tank further includes one or more partition walls, each extending from the fourth side wall to the inner side wall.

A twelfth aspect of this disclosure pertains to the system of the seventh aspect, wherein the third side wall further including a first track and the fourth side wall further including a second track.

A thirteenth aspect of this disclosure pertains to the system of the twelfth aspect further including a tray slidingly engaged with the first track and the second track.

A fourteenth aspect of this disclosure pertains to the system of the seventh aspect further including a power distribution unit (PDU) and a switch provided on an exterior surface of the third side wall or the fourth side wall.

A fifteenth aspect of this disclosure pertains to the system of the first aspect, wherein the coolant inlet pipe and the warmed fluid pipe are further coupled to a radiator and a pump external to the container.

A sixteenth aspect of this disclosure pertains to a containerized immersion cooling system including a container with a tank provided therein, wherein the container includes a first side wall having a first port and a second port; a coolant inlet pipe coupled to a first side of the first port; a warmed fluid pipe coupled to a first side of the second port; and a coolant distributor coupled to a second side of the first port, wherein the tank further includes a second side wall, wherein the first side wall is provided at a first end of the tank and the second side wall is provided at a second end of the tank opposite the first end; a third side wall and a fourth side wall flanking the first side wall and the second side wall; a base wall coupled to a bottom side of the first side wall, the second side wall, the third side wall, and the fourth side wall; and an inner side wall provided proximal to the third side wall, wherein the third side wall and the inner side wall together define a channel, wherein the first side wall, the second side wall, the third side wall, the fourth side wall, and the base wall together define a hallow portion of the tank.

A seventeenth aspect of this disclosure pertains to the system of the sixteenth aspect further including an outlet pipe coupled to a second side of the second port, wherein the outlet pipe is provided within the channel.

An eighteenth aspect of this disclosure pertains to the system of the sixteenth aspect further including a tray, wherein the third side wall further comprising a first track and the fourth side wall further comprising a second track, and wherein the tray is slidingly engaged with the first track and the second track.

A nineteenth aspect of this disclosure pertains to the system of the sixteenth aspect, wherein the coolant distributor further including a first frame including a connector configured to be coupled to the first port; a plurality of pipes coupled to the first frame, wherein each of the plurality of pipes includes a plurality of holes on a top side of the coolant distributor; and a second frame, wherein the first frame is provided at a first end of the plurality of pipes and the second frame is provided at a second end of the plurality of pipes, and wherein the first frame is internally hollow such that the plurality of holes of each of the plurality of pipes is in fluid communication with the connector.

A twentieth aspect of this disclosure pertains to the system of the sixteenth aspect, wherein the container is an intermodal container.

Before explaining the embodiments of this disclosure in detail, it is to be understood that the invention is not limited in its application to the details of the particular arrangement shown, since the invention is capable of other embodiments. Example embodiments are illustrated in referenced figures of the drawings. It is intended that the embodiments and figures disclosed herein are to be considered illustrative rather than limiting. Also, the terminology used herein is for the purpose of description and not of limitation.

DETAILED DESCRIPTION

While this disclosure is susceptible to embodiments in many different forms, there are shown in the drawings and will be described in detail herein specific embodiments with the understanding that the present disclosure is an exemplification of the principles of the invention. It is not intended to limit the invention to the specific illustrated embodiments. The features of the invention disclosed herein in the description, drawings, and claims may be significant, both individually and in any desired combinations, for the operation of the invention in its various embodiments. Features from one embodiment may be used in other embodiments of the invention.

Figure 1:
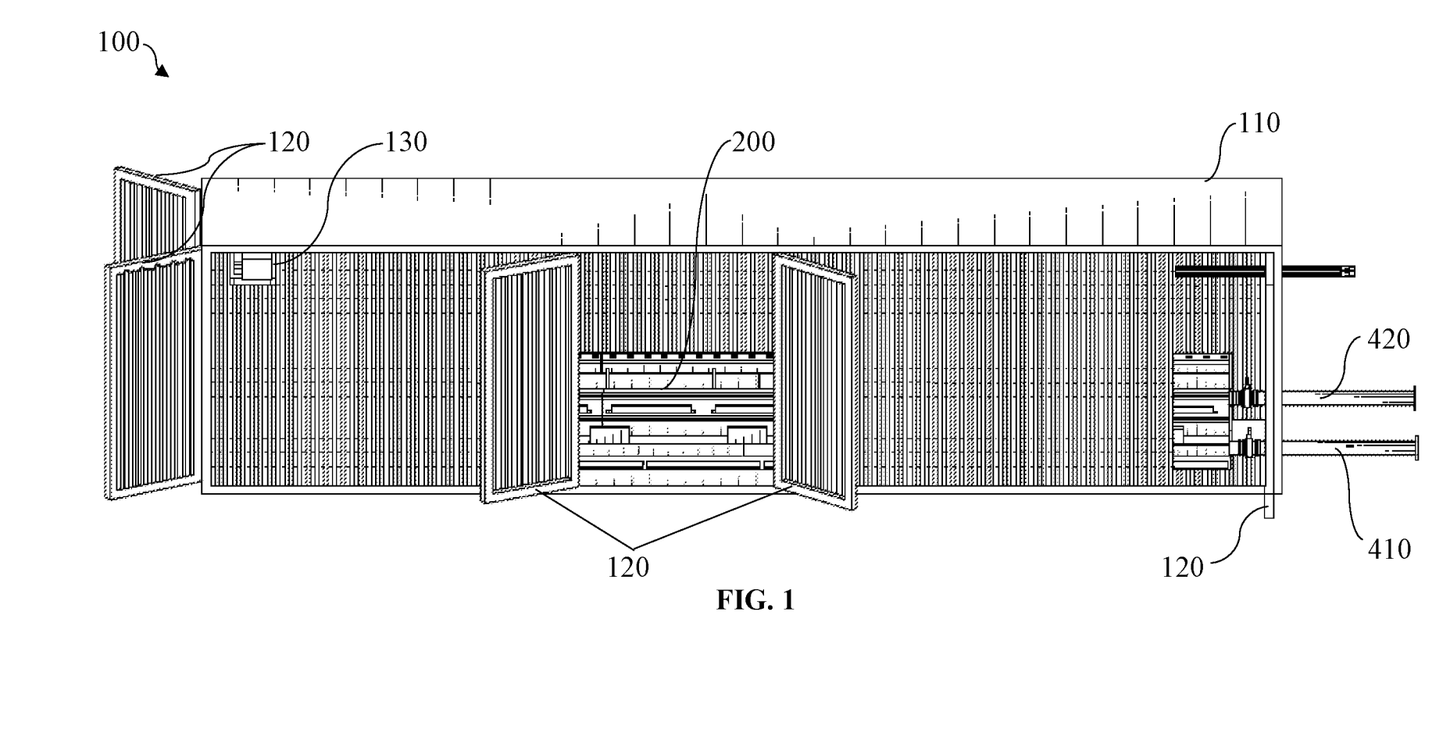
FIG. 1 illustrates a side perspective view of a containerized immersion cooling system according to an embodiment.
Figure 2:
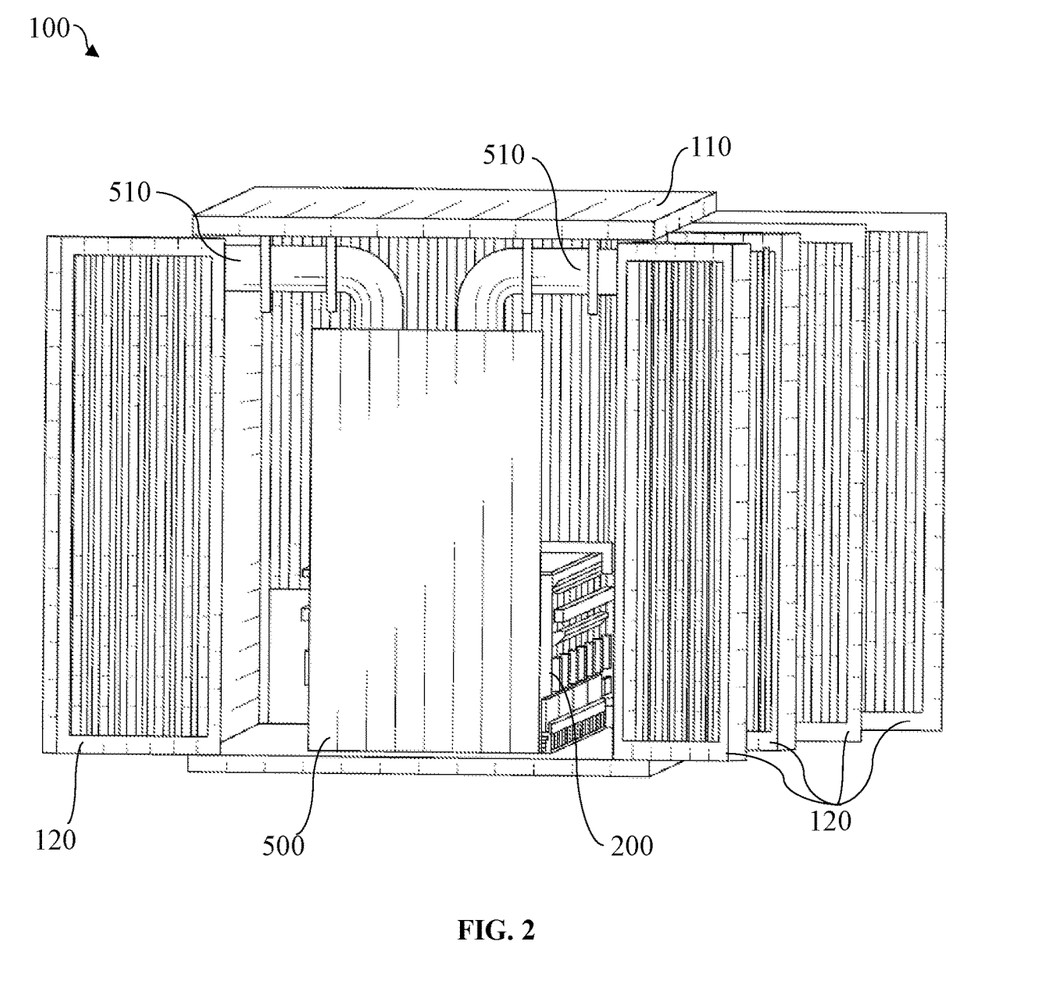
FIG. 2 illustrates a rear perspective view of the containerized immersion cooling system of FIG. 1.
Figure 3:
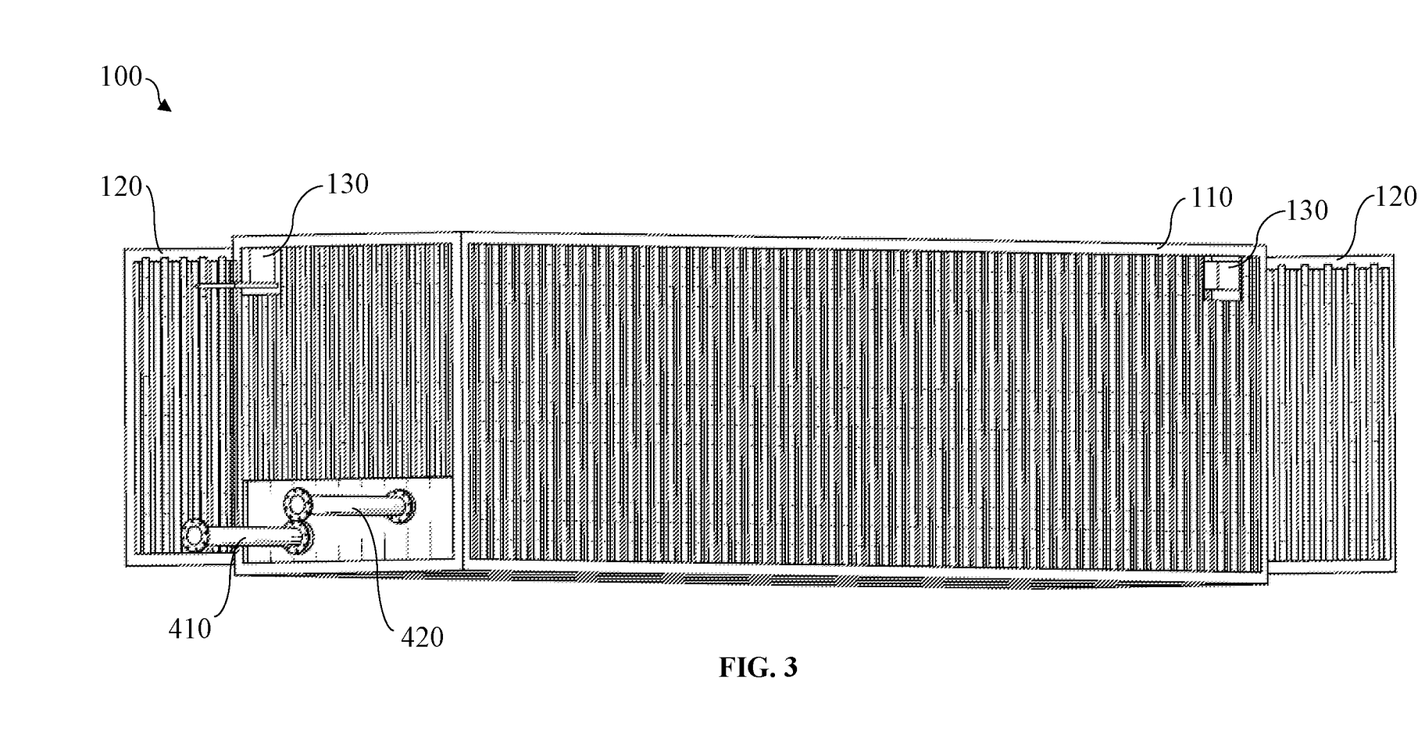
FIG. 3 illustrates another side perspective view of the containerized immersion cooling system of FIG. 1.
Figure 4:
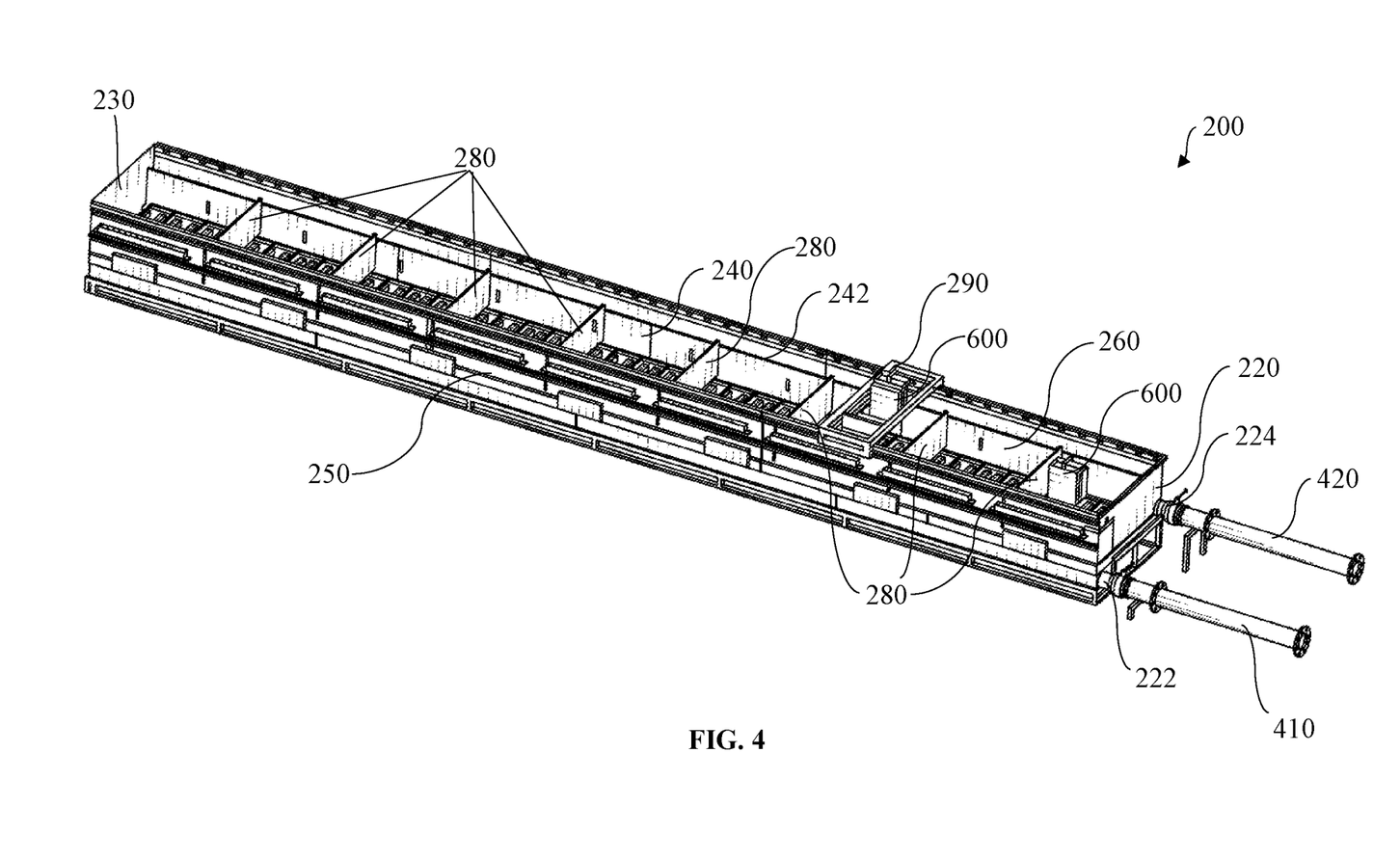
FIG. 4 illustrates a perspective view of a tank assembly according to an embodiment.
Figure 5:
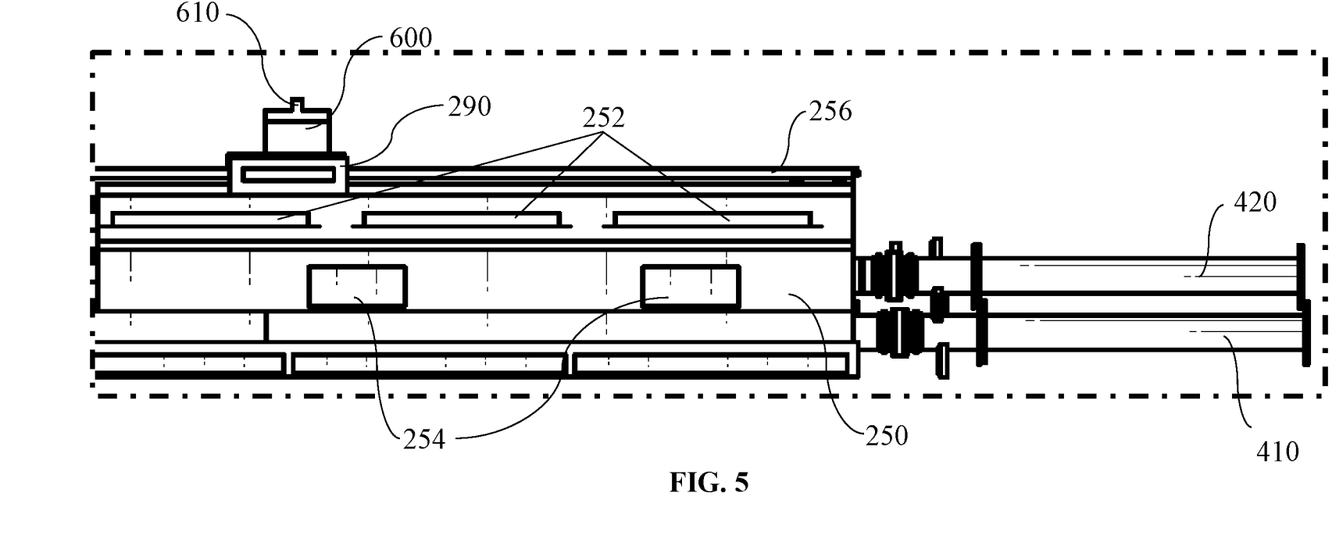
FIG. 5 illustrates a side-enlarged view of the tank assembly of FIG. 4.
Figure 6:
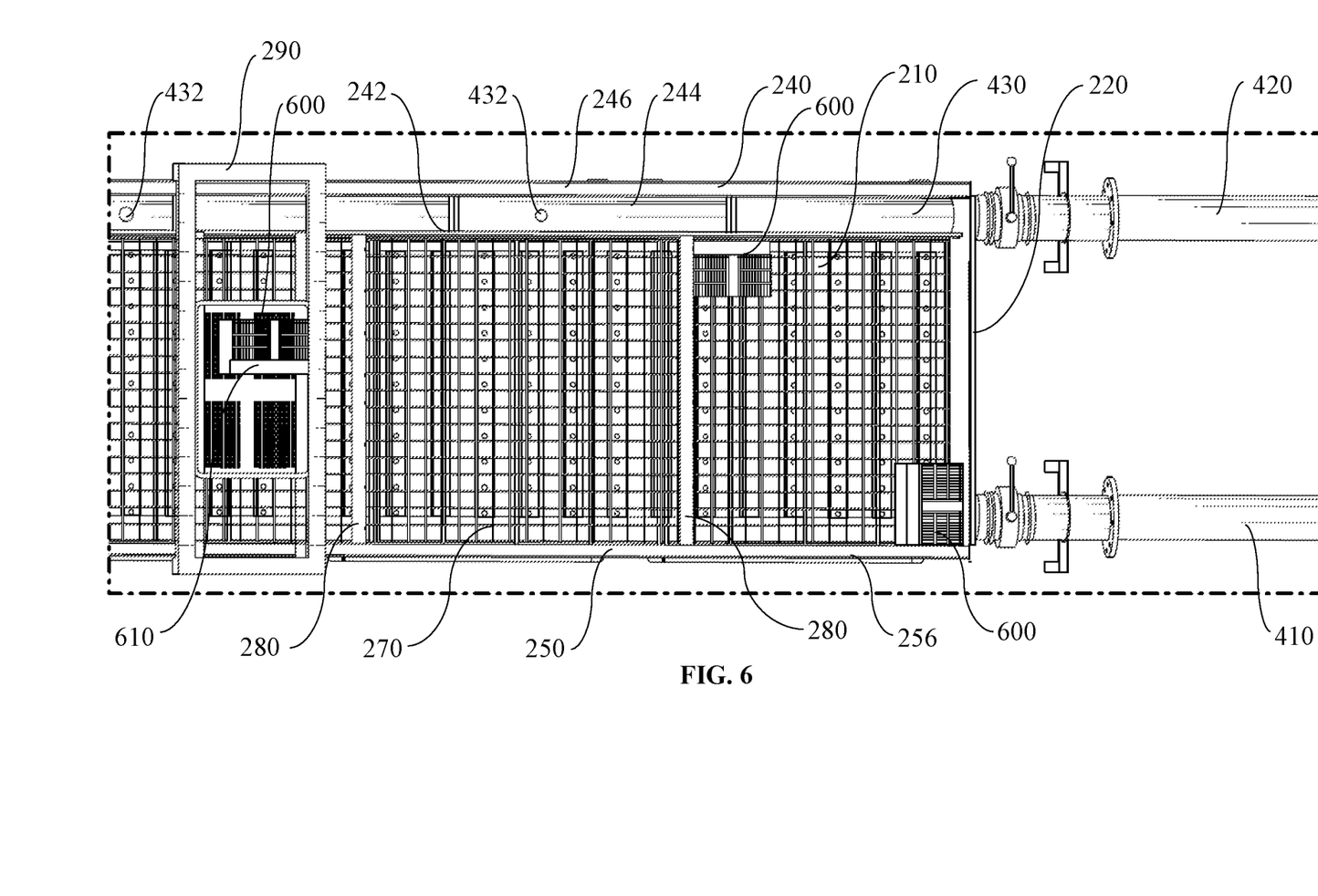
FIG. 6 illustrates a top-enlarged view of the tank assembly of FIG. 4.
Figure 7:
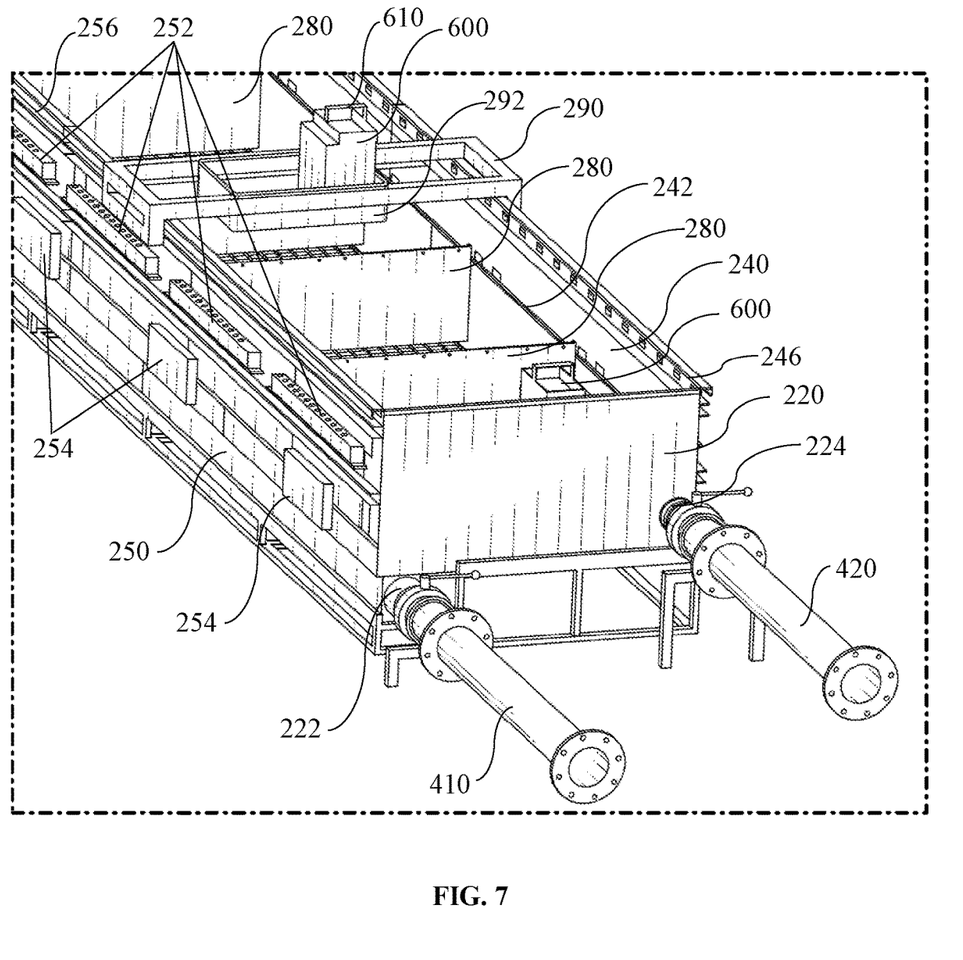
FIG. 7 illustrates an enlarged perspective view of the tank assembly of FIG. 4.

As shown in FIGS. 1-10, embodiments of this disclosure include a containerized immersion cooling system 100. Referring to FIGS. 1-3, the system 100 may include a container 110 with a tank 200 provided therein. The container 110 may be a standard-size intermodal container that is about 8 feet (ft) in width and height and about 20 ft in length or about 40 ft in length. Of course, the container 110 may be of other sizes depending on the implementation.

The container 110 may include one or more container doors 120 that serve as accesses, which may be used by operators to access the tank 200 therein. The doors 120 may be provided as double-doors, single doors, or other variations. Referring to FIGS. 1-3, a first door 120 may be provided proximal to a rear of the container 110 (see FIG. 2) for access to a rear end portion of the tank 200. A second door 120 may be provided on a side of the container 110 for access to a middle portion of the tank 200. A third door 120 may be provided on a side of the container 110 proximal to a front of the container 110 for access to a front end portion of the tank 200.

The container 110 may include one or more openings 130 for accepting various mechanical and/or electrical components therethrough. For example, a first opening 130 may be provided proximal to a front of the container 110, where one or more electrical wires may be provided through the first opening 130. A second opening 130 and a third opening 130 may be provided on a side of the container 110 proximal to a rear of the container 110, where the second opening 130 and the third opening 130 may be opposite from each other. The second opening 130 and the third opening 130 may each receive an electrical duct 510 therethrough that culminates in a breaker box 500 or a distribution panel box.

For example, referring to FIG. 2, the breaker box 500 may be provided at a rear end of the container 110 proximal to the rear end portion of the tank 200. A first electrical duct 510 may be coupled to the breaker box 500 proximal to a first side of the breaker box 500, and a second electrical duct 510 may be coupled to the breaker box 500 proximal to a second side of the breaker box 500.

Figure 10:
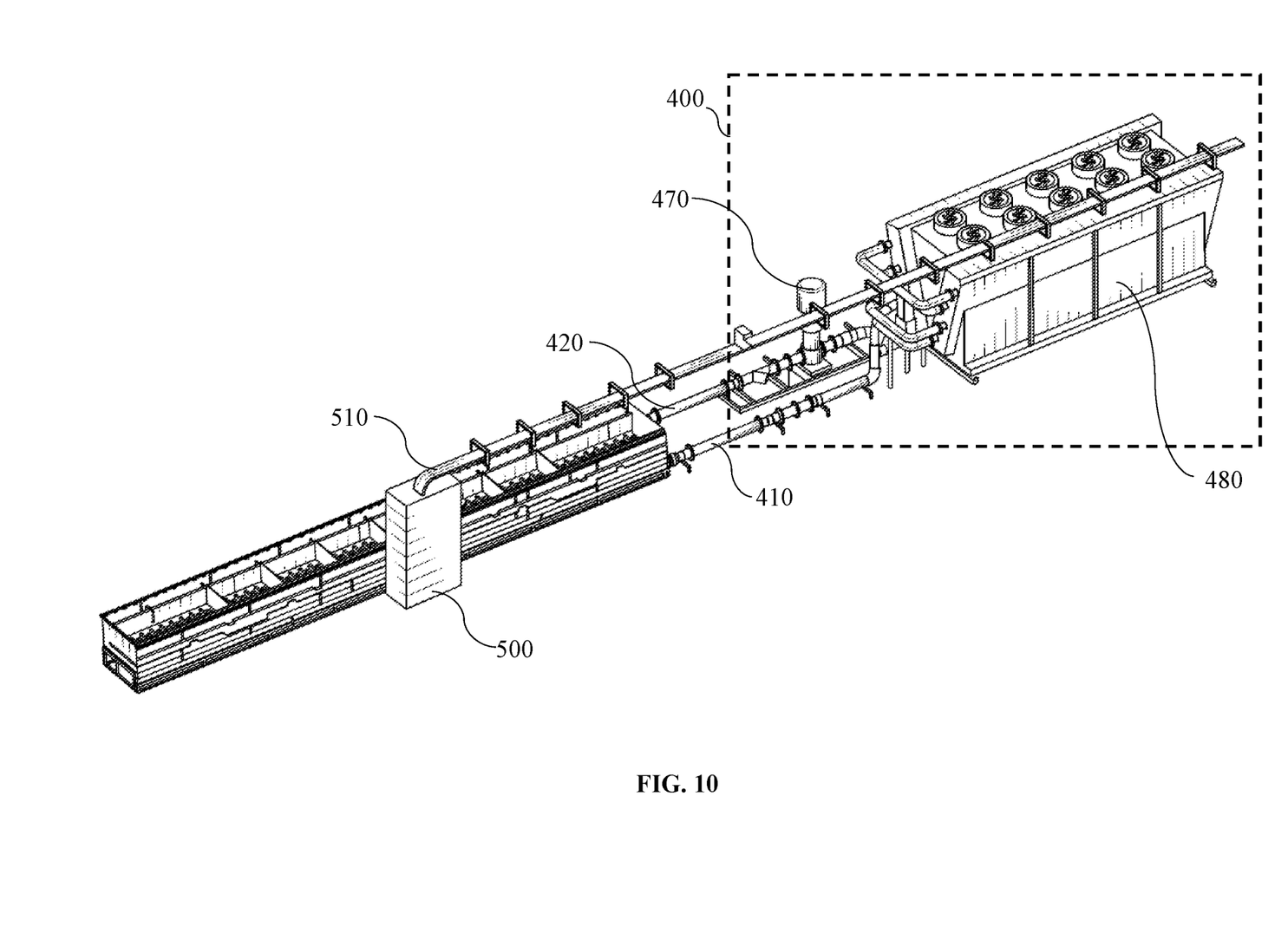
FIG. 10 illustrates a perspective view of a containerized immersion cooling system coupled to a coolant circulation system according to an embodiment.

In an alternative embodiment, referring to FIG. 10 (where the container 110 is not shown for illustration purposes), the breaker box 500 may be provided along a side of the tank 200. Moreover, the electrical duct 510 may be provided in any orientation and is not limited to the arrangements shown in the figures.

The system 100 may use cooling fluid or coolant (such as oil, dielectric fluid, or water) to remove heat from computing units 600 to keep the computing units 600 at optimal operating temperatures. Referring to FIGS. 4-7, the tank 200 may be in a shape of a trapezoidal prism. In additional embodiments, the tank 200 may be a cuboid or a half-cylinder. Other suitable shapes may also be used as would be understood.

The tank 200 may include a base wall 210, a first side wall 220, a second side wall 230, a third side wall 240, and a fourth side wall 250. The first side wall 220 may be provided at a first end of the tank 200, forming a front wall; the second side wall 230 may be provided at a second end of the tank 200 opposite from the first end, forming a rear wall; the third side wall 240 and the fourth side wall 250 may flank the first side wall 220 and the second side wall 230, thus forming a hallow portion 260 within the tank 200.

The first side wall 220 and the second side wall 230 may each be in a shape of a trapezoid, whereas the base wall 210, the third side wall 240, and the fourth side wall 250 may each be rectangular in shape. Alternative shapes are also contemplated as would be appropriate for tanks of differing shapes.

An inner side wall 242 may be provided proximal and generally parallel to the third side wall 240, whereby the third side wall 240 and the inner side wall 242 may define a channel 244 therein. In further embodiments, the inner side wall 242 may be provided proximal to the fourth side wall 250 and the channel 244 may be defined by the inner side wall 242 and the fourth side wall 250. In some embodiments, another inner side wall may be provided proximal to the fourth side wall 250 such that a second channel may be defined by the other side wall and the fourth side wall 250.

The inner side wall 242 may span an entire length or a partial length of the hollow portion 260 of the tank 200. For example, the inner side wall 242 may extend from the first side wall 220 to the second side wall 230. In additional embodiments, the inner side wall 242 may extend from the first side wall 220 and terminate at a point short of the second side wall 230. In other embodiments, the inner side wall 242 may be provided along a central portion of the tank 200 without contacting the first side wall 220 or the second side wall 230.

One or more partition walls 280 may be provided within the hallow portion 260 to partition the tank 200 into smaller segments or portions. The partition walls 280 may be provided generally perpendicular to the inner side wall 242. The partition walls 280 may span an entire width or a partial width of the hollow portion 260 of the tank 200. For example, the partition walls 280 may extend from the fourth side wall 250 to the inner side wall 242.

The third side wall 240 may include a first track 246 or groove proximal to a top end of the third side wall 240, and the fourth side wall 250 may include a second track 256 or groove proximal to a top end of the fourth side wall 256. The first track 246 and the second track 256 may each be a sliding track that may slidingly engage a tray 290 provided on top of the tank 200. Sliding oil may be provided on the first track 246 and the second track 256 to improve the ease of manipulating and/or sliding the tray 290.

The tray 290 may be provided widthwise across the top of the tank 200 and may slide along the first track 246 and the second track 256 such that the tray 290 may travel from the first side wall 220 to the second side wall 230. The tray 290 may include one or more motors (not shown) therein such that the tray 290 may be self-powered. In further embodiments, the tray 290 may be manipulated and moved along the tank 200 manually or through one or more robotic arms (not shown).

The tray 290 may further include a basket 292 for containing and/or holding a computing unit 600 thereon. The computing unit 600 may be provided with a handle 610 proximal to a top side of the computing unit 600. The handle 610 may allow the operator or a robotic arm to lift and/or lower the computing unit 600 more easily. In some embodiments, a robotic lifting system (not shown) may be installed along a top interior surface of the container 110.

One or more power distribution units (PDUs) 252 may be provided along an exterior surface of the third side wall 240 and/or the fourth side wall 250. The PDUs 252 may be electrically coupled to the breaker box 500 and may distribute power throughout the tank 200. Moreover, one or more switches 254 may also be provided along the exterior surface of the third side wall 240 and/or the fourth side wall 250 to provide switching functionalities to various electrical components.

A number of ports or connectors may be provided on the first side wall 220. For example, the first side wall 220 may include a first port 222 located proximal to a bottom of the first side wall 220 and positioned toward a first side of the first side wall 220. The first side wall 220 may also include a second port 224 located relatively higher than the first port 222 and may be positioned toward a second side of the first side wall 220.

The first port 222 and the second port 224 may each be a fluid connector (such as a threaded connector) that may be connected to a pipe on each side of the respective port. As can be appreciated, the first port 222 and the second port 224 may contain a hollow portion or through-channel that permits fluid to flow from one side of the port to the other.

Figure 8:
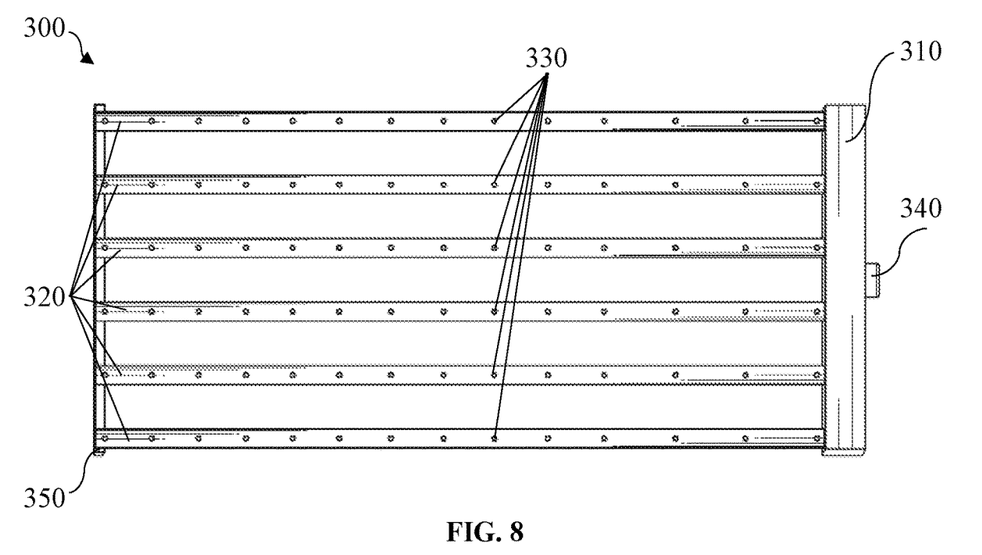
FIG. 8 illustrates a top view of a coolant distributor according to an embodiment.
Figure 9:
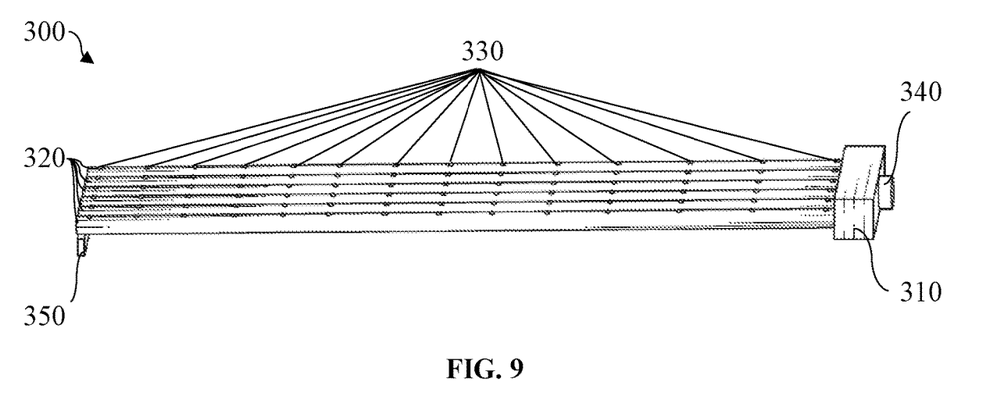
FIG. 9 illustrates a side perspective view of the coolant distributor of FIG. 8.

The first port 222 may be coupled to a coolant inlet pipe 410 on a first side, and a coolant distributor 300 on a second side opposite from the first side. As best shown in FIGS. 8 and 9, the coolant distributor 300 may include a frame 310 and a plurality of pipes 320 that run substantially lengthwise throughout the tank 200.

A plurality of holes 330 may be provided on each of the plurality of pipes 320. The plurality of holes 330 may be used to inject coolant into the tank 200. Because the plurality of holes 330 are provided on a topside of the plurality of pipes 320 away from a bottom of the tank 200 as defined by the base wall 210, dust or other debris that may otherwise settle on the bottom of the tank 200 is unlikely to obstruct the plurality of holes 330 due to the respective elevated position of the plurality of holes 330.

The frame 310 may further include a connector 340 that may be coupled to the first port 222. Although FIG. 8 illustrates the connector 340 being proximal to a middle of the frame 310, it is to be appreciated that the connector 340 may be provided at any location on the frame 310 such that the location of the connector 340 correspond to a location of the first port 222. For example, if the first port 222 is provided proximal to the fourth side wall 250 of the tank 200, the connector 340 may also be provided proximal to the fourth side wall 250 accordingly for the ease of coupling the connector 340 to the first port 222.

The frame 310 may have a hollow interior that serves as a conduit to provide fluid communication between the connector 340 to the pipes 320. Thus, liquid or coolant may flow into the coolant distributor 300 through the connector 340 and out of the plurality of holes 330.

A secondary frame 350 may be provided on the opposite end of the coolant distributor 300 from the frame 310. The secondary frame 350 may be provided generally perpendicular to the pipes 320 such that the secondary frame 350 may provide additional support to the pipes 320 and increase structural rigidly of the coolant distributor 300.

The second port 224 may be connected to a warmed fluid pipe 420 on a first side and an outlet pipe 430 on a second side opposite from the first side. The outlet pipe 430 may be provided within the channel 244 and may extend into a portion of the hollow portion 260 of the tank 200. For example, the outlet pipe 430 may extend halfway through a length of the tank 200. Alternatively, the outlet pipe 430 may extend through an entire length of the tank 200. One or more holes 432 or cutouts may be provided on the outlet pipe 430 (see FIG. 6) such that fluid may enter the outlet pipe 430.

Referring to FIG. 10, the coolant inlet pipe 410 and the warmed fluid pipe 420 may be a part of a coolant circulation system 400 that may further be coupled to a pump 470 and a radiator 480. The coolant circulation system 400 may circulate the coolant by withdrawing warmed coolant through the warmed fluid pipe 420 and injecting cooled coolant back into the tank 200 through the coolant inlet pipe 410.

A mesh 270 may be placed on top of the coolant distributor 300 to act as a support for placing one or computing units 600 thereon. The computing units 600 may not be required to be placed on the mesh 270 in any particular orientation, thus increasing flexibility and useability. For example, the computing units 600 may be placed on the mesh 270 sideways, upright, or the like. In some embodiments, the mesh 270 may be eliminated, and the computing units 600 may be placed directly on the coolant distributor 300.

The coolant may be injected into the tank 200 to immerse the computing units 600. The computing units 600 may generate heat during operation, heating up the coolant. The warmed or hot coolant may then flow to the top of the tank 200, where the warmed coolant may be drained out of the tank 200 by the pump 470 through the outlet pipe 430 via the warmed fluid pipe 420.

The hot coolant may be drained to the radiator 480, which may be remote from the tank 200. The radiator 480 may allow cold air to carry heat away from the coolant, thus cooling down the coolant. The cold coolant may then be injected back into the bottom of the tank 200 through the coolant inlet pipe 410 and the coolant distributor 300. This circulation of coolant may keep drawing heat away from the computing units 600 to cool the computing units 600.

The coolant circulation system 400 may increase the efficiency of cooling coolant versus a tradition heat exchange the utilizes water to cool dielectric fluid. In some cases, the coolant utilizing the coolant circulation system 400 may be about 5 degrees Celsius cooler than versus using a traditional heat exchange. Moreover, by eliminating heat changes, the coolant circulation system 400 may also be easier to maintain and less prone to breakdowns.

A computing unit monitoring system (PMP) may be used to increase the efficiency of the system 100 and the coolant circulation system 400. The PMP may be configured to show a status of every computing unit 600 in the system 100, including hash rate, temperature, voltage, overlocking status, online rate, or the like. PMP may also be configured to track a maintenance status of the computing units 600.

Specific embodiments of an immersion cooling system according to this disclosure have been described for the purpose of illustrating the manner in which the invention may be made and used. It should be understood that the implementation of other variations and modifications of this disclosure and its different aspects will be apparent to one skilled in the art, and that this disclosure is not limited by the specific embodiments described. Features described in one embodiment may be implemented in other embodiments. The subject disclosure is understood to encompass this disclosure and any and all modifications, variations, or equivalents that fall within the spirit and scope of the basic underlying principles disclosed and claimed herein.

What is claimed is:

1. A containerized immersion cooling system comprising:
   a container with a tank provided therein, wherein the container includes a first side wall having a first port and a second port;
   a coolant inlet pipe coupled to a first side of the first port; and
   a warmed fluid pipe coupled to a first side of the second port.

2. The system of claim 1 further comprising a coolant distributor coupled to a second side of the first port.

3. The system of claim 2 further comprising a mesh provided on top of the coolant distributor.

4. The system of claim 2, wherein the coolant distributor further comprising:
   a first frame including a connector configured to be coupled to the first port;
   a plurality of pipes coupled to the first frame, wherein each of the plurality of pipes includes a plurality of holes on a top side of the coolant distributor; and
   a second frame,
   wherein the first frame is provided at a first end of the plurality of pipes and the second frame is provided at a second end of the plurality of pipes.

5. The system of claim 4, wherein the first frame is internally hollow such that the plurality of holes of each of the plurality of pipes is in fluid communication with the connector.

6. The system of claim 1 further comprising an outlet pipe coupled to a second side of the second port.

7. The system of claim 6, wherein the tank further comprising:
   a second side wall, wherein the first side wall is provided at a first end of the tank and the second side wall is provided at a second end of the tank opposite the first end;
   a third side wall and a fourth side wall flanking the first side wall and the second side wall; and
   a base wall coupled to a bottom side of the first side wall, the second side wall, the third side wall, and the fourth side wall,
   wherein the first side wall, the second side wall, the third side wall, the fourth side wall, and the base wall together define a hallow portion of the tank.

8. The system of claim 7, wherein the tank further comprising an inner side wall provided proximal to the third side wall, wherein the third side wall and the inner side wall together define a channel.

9. The system of claim 8, wherein the outlet pipe is provided within the channel.

10. The system of claim 8, wherein the inner side wall extends from the first side wall to the second side wall.

11. The system of claim 8, wherein the tank further comprising one or more partition walls, each extending from the fourth side wall to the inner side wall.

12. The system of claim 7, wherein the third side wall further comprising a first track and the fourth side wall further comprising a second track.

13. The system of claim 12 further comprising a tray slidingly engaged with the first track and the second track.

14. The system of claim 7 further comprising a power distribution unit (PDU) and a switch provided on an exterior surface of the third side wall or the fourth side wall.

15. The system of claim 1, wherein the coolant inlet pipe and the warmed fluid pipe are further coupled to a radiator and a pump external to the container.

16. A containerized immersion cooling system comprising:
   a container with a tank provided therein, wherein the container includes a first side wall having a first port and a second port;
   a coolant inlet pipe coupled to a first side of the first port;
   a warmed fluid pipe coupled to a first side of the second port; and
   a coolant distributor coupled to a second side of the first port,
   wherein the tank further comprising:
     a second side wall, wherein the first side wall is provided at a first end of the tank and the second side wall is provided at a second end of the tank opposite the first end;
     a third side wall and a fourth side wall flanking the first side wall and the second side wall;
     a base wall coupled to a bottom side of the first side wall, the second side wall, the third side wall, and the fourth side wall; and an inner side wall provided proximal to the third side wall, wherein the third side wall and the inner side wall together define a channel, wherein the first side wall, the second side wall, the third side wall, the fourth side wall, and the base wall together define a hallow portion of the tank.

17. The system of claim 16 further comprising an outlet pipe coupled to a second side of the second port, wherein the outlet pipe is provided within the channel.

18. The system of claim 16 further comprising a tray, wherein the third side wall further comprising a first track and the fourth side wall further comprising a second track, and wherein the tray is slidingly engaged with the first track and the second track.

19. The system of claim 16, wherein the coolant distributor further comprising:
- a first frame including a connector configured to be coupled to the first port;
- a plurality of pipes coupled to the first frame, wherein each of the plurality of pipes includes a plurality of holes on a top side of the coolant distributor; and
- a second frame,
- wherein the first frame is provided at a first end of the plurality of pipes and the second frame is provided at a second end of the plurality of pipes, and
- wherein the first frame is internally hollow such that the plurality of holes of each of the plurality of pipes is in fluid communication with the connector.

20. The system of claim 16, wherein the container is an intermodal container.

\* \* \* \* \*